United States Patent
Chapman

(10) Patent No.: US 8,823,356 B2
(45) Date of Patent: Sep. 2, 2014

(54) SUPPLY VOLTAGE AUTO-SENSING

(75) Inventor: Patrick L. Chapman, Austin, TX (US)

(73) Assignee: SolarBridge Technologies, Inc., Austin, TX (US)

( * ) Notice: Subject to any disclaimer, the term of this patent is extended or adjusted under 35 U.S.C. 154(b) by 606 days.

(21) Appl. No.: 13/052,358

(22) Filed: Mar. 21, 2011

(65) Prior Publication Data

US 2012/0242322 A1 Sep. 27, 2012

(51) Int. Cl.
*G01R 19/00* (2006.01)
*G01R 19/02* (2006.01)
*G01R 19/165* (2006.01)
*H02H 3/34* (2006.01)
*H02H 3/353* (2006.01)

(52) U.S. Cl.
CPC .......... *G01R 19/02* (2013.01); *G01R 19/16547* (2013.01); *G01R 19/16566* (2013.01); *G01R 19/003* (2013.01); *H02H 3/343* (2013.01); *H02H 3/353* (2013.01)
USPC .............. 324/76.11; 361/76; 361/79; 361/85; 361/86; 307/127; 307/129; 307/130

(58) Field of Classification Search
CPC ............ G01R 19/02; G01R 19/16547; G01R 19/16566; G01R 19/003; H02H 3/343; H02H 3/353
USPC .......................................... 324/76.11; 361/76
See application file for complete search history.

(56) References Cited

U.S. PATENT DOCUMENTS

| | | | | |
|---|---|---|---|---|
| 4,251,766 A | * | 2/1981 | Souillard | 324/521 |
| 4,581,705 A | * | 4/1986 | Gilker et al. | 702/60 |
| 5,045,991 A | * | 9/1991 | Dhyanchand et al. | 363/89 |
| 5,450,029 A | * | 9/1995 | Jacobs et al. | 327/348 |
| 5,453,903 A | * | 9/1995 | Chow | 361/79 |
| 5,506,743 A | * | 4/1996 | Phillips | 361/85 |
| 5,654,625 A | * | 8/1997 | Konstanzer et al. | 323/211 |
| 6,160,692 A | * | 12/2000 | Zaretsky | 361/86 |
| 7,023,196 B2 | * | 4/2006 | Khan et al. | 324/521 |
| 7,352,549 B1 | | 4/2008 | Greizer et al. | |
| 7,746,054 B2 | * | 6/2010 | Shuey | 324/110 |
| 8,589,099 B2 | * | 11/2013 | Holdsclaw | 702/64 |
| 2004/0249876 A1 | * | 12/2004 | Tuladhar | 708/490 |
| 2010/0053828 A1 | * | 3/2010 | Selejan | 361/76 |
| 2011/0068712 A1 | * | 3/2011 | Young | 315/307 |
| 2012/0025799 A1 | * | 2/2012 | Tournatory et al. | 323/285 |
| 2012/0089354 A1 | * | 4/2012 | Holdsclaw | 702/64 |
| 2013/0278240 A1 | * | 10/2013 | Frampton | 324/76.11 |

OTHER PUBLICATIONS

Chapman, et al., AC Modules and Solar Power Electronics, www.Solarbridgetech.com, Oct. 8, 2010.
Chapman, et al., Safety Advantages of AC-Module Systems for Solar Power, www.Solarbridgetech.com, Oct. 8, 2010.

(Continued)

*Primary Examiner* — Benjamin M Baldridge
(74) *Attorney, Agent, or Firm* — Grasso PLLC; Fred Grasso

(57) ABSTRACT

Processes, machines, and articles of manufacture that may serve to enable the detection or determination of alternating line voltages from an alternating power source, such as the power grid, are provided. This automatic sensing may be useful when connections are made to the power grid, such that when connections are made, the connections may be configured to be compatible with the available power source. This automatic sensing may also be useful if power sources change characteristics over time or if devices may be connected to different power sources over time.

22 Claims, 7 Drawing Sheets

(56) References Cited

OTHER PUBLICATIONS

Solarbridge Management System, www.Solarbridgetech.com, Copyright 2010.

SolarBridge Pantheon(TM) MicroInverter, www.Solarbridgetech.com, Copyright 2010.

The SolarBridge Solution Simply More Reliable AC Solar, www.Solarbridgetech.com, (dated Sep. 30, 2010).

IEEE Standard 1547.1 "IEEE Standard Conformance Test Procedures for Equipment Interconnecting Distributed Resources with Electric Power Systems," Jul. 1, 2005.

IEEE Standard 1547 "IEEE Standard for Interconnecting Distributed Resources with Electric Power Systems," Jul. 28, 2003.

UL 1741 Standard for Safety "Inverters, Converters, Controllers and Interconnection System Equipment for Use with Distributed Energy Resources," Nov. 7, 2005.

* cited by examiner

SUPPLY VOLTAGE AUTO-SENSING

BACKGROUND

The present invention relates to automated voltage detection, and more specifically to processes, machines, and manufactures, directed to the automated detection, identification, and selection of available alternating voltage power supplies.

Alternating current and voltage can be delivered or made available by a power source in single-phase and multi-phase waveforms. Electrical devices, such as motors, are designed to receive and be powered by one of these waveforms such that single-phase motors cannot run on multi-phase power and vice-versa.

As the name suggests, single-phase alternating power delivers a single waveform over a wire where the voltage ranges between positive and negative peaks while passing through a zero crossing. Comparatively, multi-phase waveform power supplies regularly use multiple wires and deliver several alternating waveforms over one or more wires. The waveforms are often offset in time from one another by a fraction of their period.

Existing power sources, such as the public electrical power supply grid, provide power generally using several kinds of multi-phase power including split-phase and three-phase wye power supplies. Split-phase delivers two waveforms while three-phase delivers three waveforms. Both systems may use four wires to transmit the power. In the split-phase system, two voltage waveforms may be sent over two wires 180° out of phase with each other. In the three-phase system, three voltage waveforms may be sent over three wires 120° out of phase with each other. Thus, the same four wires on the power grid can provide power with differing characteristics and properties.

Split-phase four wire power lines may have four connections to an AC power grid: L1, L2, N, and G, where the "lines" L1 and L2 are the main power lines that carry current, where "N" is the grid neutral, and "G" is the safety ground. In normal operation, neither the neutral nor the safety ground carries any current, however, in the event of a fault, the ground can carry current.

In a split-phase, 240-V connection system (typical of U.S. residential power supplies), L1 and L2 have a voltage of about 120 V with respect to N and are 180 degrees out of phase.

$$v_{L1-N} = V_p \sin(\omega t)$$

$$v_{L2-N} = V_p \sin(\omega t - \phi_{split})$$

Here, the peak line-to-neutral voltage is nominally $V_p = \sqrt{2}(120\ V)$ and the phase shift is $\phi_{split} = \pi$ rad, or 180 degrees. The frequency is $\omega$.

For the three-phase, 208-V, Y-connected system (or wye-connected system) there are three voltage supplies each sharing a common (neutral, N) connection. The voltages have time-varying values ideally of the form:

$$v_{A-N} = V_p \sin(\omega t)$$

$$v_{B-N} = V_p \sin(\omega t - \phi_Y)$$

$$v_{C-N} = V_p \sin(\omega t + \phi_Y)$$

Here, the peak voltage from line to neutral is ideally the same as the split-phase case. The phase shift is instead 120 degrees, or $\phi_Y = 2\pi/3$. The line-to-line voltages are formed from the difference between any two of the three line-to-neutral voltages. The peak line-to-line voltage is $\sqrt{3}V_p$ and for the 208-V system, $\sqrt{2}V_p = \sqrt{2}(208\ V)$.

Embodiments provided herein are directed to, among other things, processes, machines, and manufactures supporting the automated detection, identification, and selection of available alternating voltage power supplies, including power grids supplying single-phase power and multi-phase power. Other embodiments, detecting, identifying, and selecting, other voltages and supplies, may be plausible as well.

BRIEF SUMMARY

Embodiments may include processes, machines, and articles of manufacture. These embodiments may serve to provide for or enable the detection or determination of alternating line voltages from an alternating power source, such as the power grid. This automatic sensing may be useful when connections are made to the grid, such that when connections are made, the connection may be configured at that time to be compatible with the available power source. This automatic sensing may also be useful if power sources change characteristics over time or if devices may be connected to different power sources over time. There are other useful applications for embodiments as well.

Embodiments may include methods for detecting single or multi-phase voltages, voltage supply auto-sensors, root mean square measuring units, methods of auto-sensing alternating power grid line voltage, inverters, power managers, and numerous other processes, methods, machines, and manufactures. Embodiments may include determining a local RMS value of alternating voltages on a first line and a second line, determining the RMS of the product of these alternating voltages, comparing these determinations, and designating the first line and the second line as carrying a single-phase voltage, split-phase voltage or a multi-phase voltage using the comparison. Embodiments may or may not also exclude the consideration of voltage phase angles in the first line and the second line when designating the first line and the second line as carrying a single-phase voltage, split-phase voltage or a multi-phase voltage. Still further, embodiments may also include: a factor of safety when making comparisons to account for line fluctuations and imperfections from expected normals; an introduced waiting state; and a transient state. Still further modifications are plausible as well.

An auto-sensor embodiment may include a comparator having three inputs, where the inputs receive values representing an alternating voltage or the product of an alternating voltage measured from a power source. This and other embodiments may also include a voltage selector in communication with the comparator, where the voltage selector receives an output from the comparator and the voltage selector and provides an indicator for determining the voltage of a measured power source. Still further, embodiments may also include root mean square measuring units (RMSMU) and voltage supply auto-sensors (VSAS) that communicate with each other and serve to determine the line voltage characteristics of a power source.

Embodiments may be implemented in firmware, computer executed code, specialty programmed computers, and combinations thereof. Still further embodiments and combinations may also be implemented.

The invention and embodiments thereof will be further described and appreciated from the accompanying detailed description in conjunction with the accompanying drawings.

DETAILED DESCRIPTION

Embodiments of the invention may provide automatic sensing of a voltage source when initially coupled to the voltage source, during session startup, and at other times as well. Embodiments may be implemented in numerous configurations including various circuit layouts, various programming implementations, combinations of circuit-layout design and programming implementations, and through other configurations as well.

In embodiments, a device connected to a power grid may automatically sense the available alternating voltage of the power grid. This automatic sensing may include determining whether the device is connected to a 208V three-phase power grid or a 240V split-phase power grid. This automatic sensing may be used when determining the characteristics of a single available voltage-source; to select between plausible voltage-sources; to determine if an available voltage-source meets certain criteria; and for various other reasons as well. In so doing, embodiments can provide flexibility for device manufacture or design when the use or operational environment of the device is not specifically known before installation or can change thereafter. Embodiments may provide flexibility in other scenarios as well.

In embodiments, real-time voltage sensing may be employed by an inverter or other device coupled to or in communication with an alternating supply voltage. This real-time sensing may be employed at installation, startup, and throughout lifecycle deployment. The inverter or other device may employ specific circuit designs, specifically programmed processors, and combinations thereof. In embodiments, specifically configured processors, rather than specific firmware designs, may be used when sampling rates of the alternating waveform are preferably less than 512 samples per line cycle. Still further, the real-time voltage sensing may be employed without the need to measure, comparing, or consider the phase angle of the available power grid supply voltages.

Figure 1:
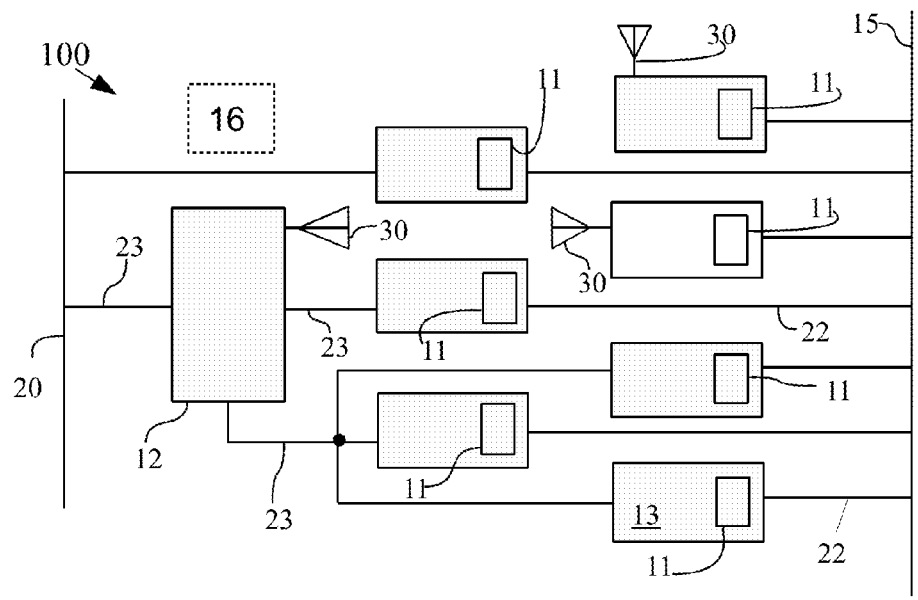
FIG. 1 shows an array of solar panels with individual microinverters and a power manager for the array of solar panels as may be employed in accord with embodiments of the invention.

FIG. 1 shows a solar-array power system 100 as may be employed in embodiments. Visible in FIG. 1 are power source lines 15, network connection 20, solar panels 13, microinverters 11, and power manager 12. Also visible are antennas 30 of certain solar panels 13, and power manager 12. The power manager 12 may be in communication with each solar panel 13 via a wired connection 23, an antenna 30 connection, or both. The power manager 12 may also be in communication with the network 20. This network connection may be used to manage the power output of the solar panels as well as to report on the operation or status of each solar panel.

In embodiments, the solar-array power system 100 may have the solar panels 13 coupled to power source lines 15 and a local load 16. When solar panels 13 are producing electrical power, the power may be routed completely to the local load 16, completely to the power source lines 15, and portioned out in percentages to both the power source lines 15 and the local load 16. The manner and extent to which electrical power is sent out to either or both the local load and the power source lines may be controlled, in part, by the microinverters 11 of each solar panel 13, and in part by the power manager 12. In embodiments the solar panel generated power may also be used to detect and select the characteristics of the power grid.

In embodiments, during setup or afterwards, the microinverters 11 may determine the voltage characteristics of the power source lines 15 such that when the microinverter is supplying power back into the power source lines, the electrical power supplied by the microinverter may be consistent with the power source lines. For example, if the power source is a three-phase 208V wye service, the microinverter may provide electrical power that is consistent with industry guidelines for three-phase 208V wye service. Likewise, if the microinverter determines that the power source lines 15 are providing a split-phase 240V supply, the microinverter may provide electrical power for the power source lines 15 that is consistent with industry guidelines for split-phase 240V electrical service. In preferred embodiments, the type of electrical power being provided to the power source 15, e.g. 240V split-phase or 208V three-phase, may be consistent with the power also provided to the load 16. Conversely, however, in embodiments, the type of electrical power being provided to the power source 15, e.g. 240V split-phase or 208V three-phase, may not be consistent with the power provided to the load 16. In embodiments, an inverter such as a microinverter, or other device may toggle between operating states to provide output power voltages consistent with the target recipient of the power, such as a load. This toggling back and forth may occur for periods of time and may be, in part or completely dictated by a power manager such as the power manager 12.

The status of each microinverter 11 may be relayed to the power manager 12 during operation or otherwise. This status may include the real-time voltage conversion designation as well as other real-time information. The power manager 12 may use this information when managing the solar-array power system 100 and may communicate it outside of the system 100 via the network 20.

In embodiments, the microinverters 11 may be configured in their firmware circuit design, through executable code stored or running, i.e. software, or both, to verify that the voltage available on the power source lines 15 meets applicable guidelines and standards. This verification can include performing tests to determine whether the power source voltage is consistent with UL 1741 and IEEE 1547 standards. In embodiments, test results can be relayed to the power manager 12 and via the network 20 to external clients. The test results can also be shared with other microinverters and used, for example, to shut down all affected microinverters for a test failure, as well as to share a passing test with microinverters when the test results fall within requisite standards.

In embodiments, according to definition, the RMS value of a waveform that may be considered is:

$$V_{RMS} = \sqrt{\frac{1}{T}\int_0^T v(t)^2 dt}$$

Here v(t) is the time-varying, period signal and T is the period. As is often the case in real world power grids, the signals are not periodic and, in fact, are assumed not to be periodic according to the standard. Therefore, the theoretical definition of RMS requires periodicity (i.e., the signal must repeat forever) when, in reality, the signal will vary in peak, phase shift, and frequency as time progresses. Thus, the standard is somewhat in conflict with the theoretical definition of RMS. Nevertheless, in embodiments, a "local" RMS may be defined so that only a narrow range of time is considered for the computation of RMS. For example, one cycle of a 60-Hz ($\omega=2\pi60$ rad/s) may be used so that a "cycle RMS" can be computed, likewise, multiple cycles may also be considered. When multiple cycles are considered a finite known number is preferred, e.g. three, nine, and twenty-seven sampling cycles.

As further explained herein, in embodiments, once the nominal grid voltage of a power source is determined, this determination may be used to perform additional tests or checks. For example, in embodiments, if the (rms) voltage, "local," "cycle" or otherwise, of a grid power source is above 110% of the expected nominal grid voltage, an embodiment may shut down in one second or other period of time and relay this same information to a manager. Likewise, if the (rms) voltage, "local," "cycle" or otherwise, of a grid power source is above 120% of the expected nominal grid voltage, an embodiment may shut down in 160 milliseconds or less, and may also relay this information to a power manager. In embodiments, other trip times may be used for these and other nominal voltages. For example, the trip times can include two second and 160 millisecond trip times for 88% and 50% nominal voltage readings, respectively. Thus, in embodiments, the determination of the power grid nominal value (208V or 240V) may be used to establish the applicable trip point.

In certain applications, as noted earlier, the peak voltages and phase shifts of the power source being analyzed and detected may not have ideal values. For example, conventional power grids regularly drift from expected nominal values under the influence of line conditions. When these line conditions have values meaningfully outside of the nominal range, an abnormal condition can exist. In embodiments, an abnormal condition may preferably trigger a shut-down (or fault) condition for the inverter or other device coupled to the power grid. Thus, compliance with IEEE or other safety standards may be tested for in embodiments before, during or after power source analysis occurs.

Similarly, a safety factor may be used in embodiments to accommodate power grids exhibiting some degree of harmonics. These harmonics may exist as ideal sinusoidal voltages, i.e., the RMS value of the voltage is the peak divided by the square root of two, may not be available or may not be consistently available. In embodiments, thus, ideal and non-ideal power sources may be analyzed and determined. When performing the analysis or determination, preferred embodiments may rely on its computation of the RMS value of the voltages as necessitated by IEEE 1547 or other applicable standard. Embodiments may also verify that the line-to-neutral voltages individually fall within expected or predetermined trip limits. This trip limit circuitry may be implemented in firmware and software embodiments where the line-to-neutral voltages may be determined, compared to benchmark values, and triggered when the detected voltages violate the benchmarks.

Still further, in embodiments, a "local" RMS value may be computed digitally on a "running average" basis where 256 samples of the waveform, or other sample set, may be collected and stored for subsequent manipulation or calculation. The samples may be taken at a frequency of 15,360 Hz, which corresponds to 256 samples per 60-Hz cycle, in other words about 65 µs per sample. Other frequencies and sample rates may be used to approximate or determine the "local" RMS value. Moreover, these sample rates can be varied to adjust the accuracy of the RMS calculation and for other reasons as well. The approximate "local" RMS value may be modeled using the following equation:

$$V_{RMS,app} = \sqrt{\frac{1}{T}\sum_{n=255}^{n} v_n^2 \Delta t}$$

In the above equation, the "approximate" RMS value is computed with the voltage samples $v_n$ and the sample time spacing is $\Delta t$.

In embodiments, the microinverter 11 may be configured to determine the running RMS value of both line-to-neutral voltages, $V_{L1,RMS}$ and $V_{L2,RMS}$ and compares those to IEEE 1547 trip limits to ascertain which power grid (208V or 240V) the microinverter 11 is attached to. In so doing, and as explained below, the microinverter 11 may be further configured to determine the product of the samples from L1–N and L2–N and to determine the RMS value of the product. In a subsequent step, the RMS of the product may be reduced by the square root to determine $V_{prod,RMS}$.

In embodiments, the line voltage determination is preferably determined immediately when an AC grid is connected to the microinverter 11. The measurement should be conducted and maintained for a minimum amount of time, e.g., 10 seconds, to allow initial transients, to be skipped or otherwise ignored when determining the applicable line voltage. When determined, the microinverter 11, power manager 12 or other device may report out via the network communication link 20 or the antennas 30 so that the determination can be stored and referred to at a later time, or otherwise used.

In embodiments, the line voltage determination may be checked each time the AC power is connected (or reconnected) so that the microinverter 11 or other device is preferably and consistently made aware of the type of power supply it is connected to. In embodiments, the microinverter 11 or other device may periodically re-verify which power supply it is connected to and may synchronize this information with the Power Manager 12. In embodiments, a nightly synchronization may be conducted. For these nightly synchronizations and for other instances when the solar panels are not serving to provide power to the microinverter, the microinverter may draw power from the power source 15 rather than the solar panel power source.

Embodiments may include one or more Root Mean Square Measuring Units ("RMSMU") as well as one or more Voltage Supply Auto-Sensors ("VSAS"). These may be included in the microinverters 11 described herein, other inverters and in other locations or portions of the device or system embodiments.

Figure 2:
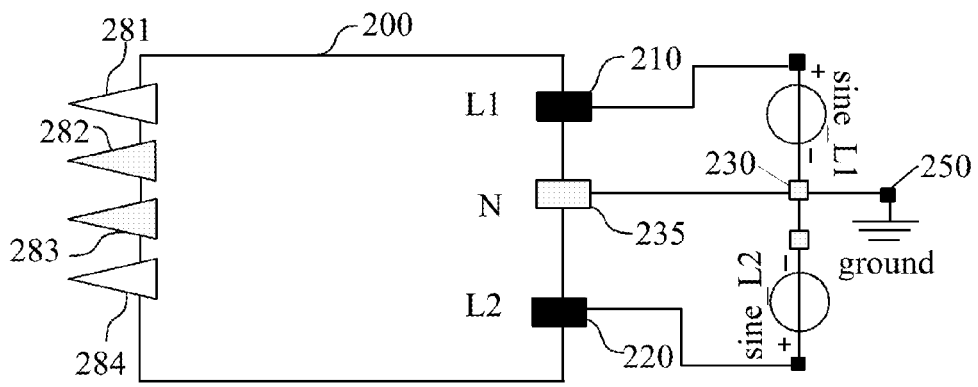
FIG. 2 shows an RMS Measurement Unit coupled to a 240V split-phase power source as may be employed in accord with embodiments of the invention.
Figure 3:
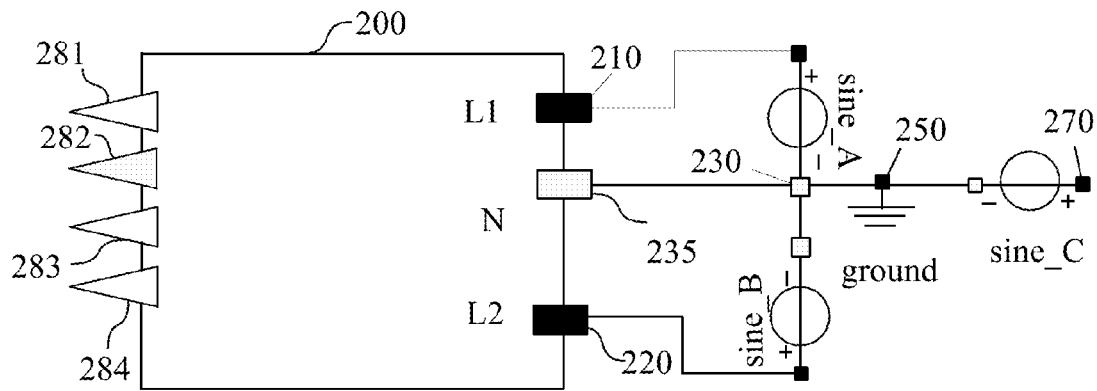
FIG. 3 shows an RMS Measurement Unit coupled to a 208V three-phase power source as may be employed in accord with embodiments of the invention.

FIGS. 2 and 3 show an RMSMU 200 as may be employed in embodiments. The RMSMU 200 may be used when detecting split-phase power grids as well as three-phase power grids. FIG. 2 shows the RMSMU 200 applied in a split-phase power system while FIG. 3 shows the same RMSMU 200 applied in a three-phase power grid application. As can be seen, in the three-phase power system application, one of the legs of the power grid may not be connected to an input 210 or 220 of the RMSMU 200. The inputs for the RMSMU 200 can include a Line 1 input 210, a Line 2 input 220, and a Line neutral input 235. As shown in FIG. 2, the Line 1 input 210 can reflect the oscillating sinusoidal signal voltage of a first leg of the power grid compared to neutral 230 while the Line 2 input 220 can reflect the oscillating sinusoidal signal of a second leg of the power grid compared to neutral 230. FIG. 2 also shows that the neutral input 235 may be connected to ground 250.

FIG. 3 shows that a third leg 270 of the power grid need not be connected to the RMSMU 200. As can be seen, this third leg 270 is protected by ground from the RMSMU 200. Thus, in both wiring scenarios, either using the split-phase grid, or the three-phase power grid, the wiring set up of the RMSMU may be similar or even consistent.

In use, the RMSMU may receive power source voltages at Line 1 input 210 and Line 2 input 220 and may output a sampling or signal frequency, a root mean square value of the voltages on Line 1 and Line 2, and the square root of the product of the root mean squares of Line 1 and Line 2. These determinations may be output at 281, 282, 283, and 284, and may be used by a Voltage Supply Auto-Sensor or means for automatically sensing a voltage supply, to determine the configuration of the power source or power grid that the RMSMU is coupled to.

Figure 4:
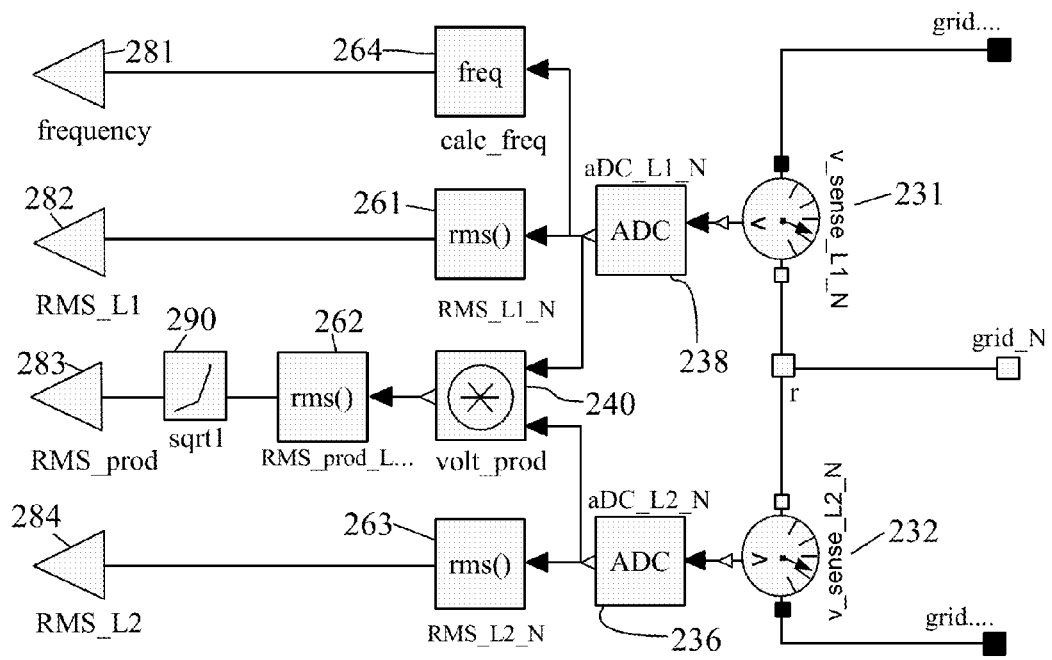
FIG. 4 shows a circuit block diagram of an RMS Measurement Unit coupled to a 240V split-phase power source as may be employed in accord with embodiments of the invention.
Figure 5:
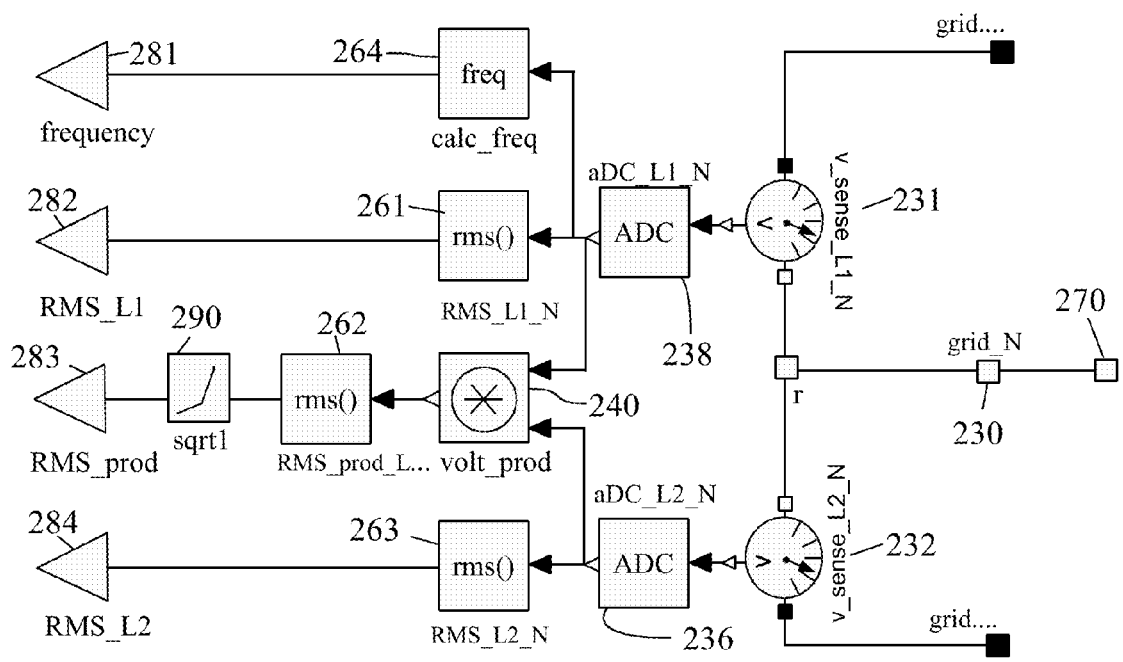
FIG. 5 shows a circuit block diagram of an RMS Measurement Unit coupled to a 208V three-phase power source as may be employed in accord with embodiments of the invention.

FIGS. 4 and 5 show circuit block diagrams of the RMSMU 200 of FIGS. 2 and 3, as may be employed in embodiments. Visible in these circuit block diagrams are analog to digital converters 236 and 238, sampling frequency circuit 264, Root Mean Square calculator circuits 261, 263, and 290, line voltage multiplier 240, square root calculator circuit 290, and voltage sensor circuits 231 and 232.

In operation, the voltage sensor circuits 231 and 232 may be configured to represent a scaled value of the alternating line voltages of the two power source lines of which the RMSMU is connected. In embodiments, an upper or lower limit of the voltage sensors may be ±3.2 volts such that the line voltage reported by the respective voltage sensors 231 and 232 may be 2% of the actual line voltage of the power grid. Other relationship, including other linear relationships, may be output by the voltage sensors to the analog to digital converters. In preferred embodiments, the max output voltage of the sensors 231 and 232 may be ±5.0 V.

The analog to digital converters 236 and 238 may convert the scaled analog voltage signals into digital outputs. The sampling rate of the converters may be set such that a known sample group comprises a single waveform cycle. For example, when the cycle speed of the AC waveform is 60 Hz, the samples may be taken at a frequency of 15,360 Hz, such that 256 samples may be taken per waveform and such that each sample may be taken 65 μs apart from adjacent samples. These samples may be sent individually or in sets from the ADCs to: the RMS Calculator circuits 261, and 263; to the line voltage multiplier 240; and to the sampling frequency circuit 264. The sampling frequency circuit 264 may be configured to receive the individual samples or the sets of samples and to determine and report out, at output 281, the sampling frequency of the analog to digital converters 236 and 238. The RMS circuits 261 and 263 may receive the signals from the ADCs 231 and 232 and may determine the root mean square of the voltage of the line coupled to the applicable ADC. In embodiments, the RMS circuit 261 and 263 may determine new RMS values after each received signal from the ADC using a last in first out methodology for the sampling set. Also, the RMS circuits 261 and 263 may gather sets of signals from the ADC and calculate RMS values at set intervals or after certain criteria have been met. The RMS value may then be reported at outputs 282 and 284.

In embodiments, a voltage multiplier 240 may receive individual voltage signals from the ADCs 236 and 238 and determine the product of these signals for output to RMS circuit 262. This RMS circuit 262 may determine the RMS value of the $L_1L_2$ product and output that product value to the square root calculator circuit 290, which my take the square root of the value and report the value at output 283.

Figure 6:
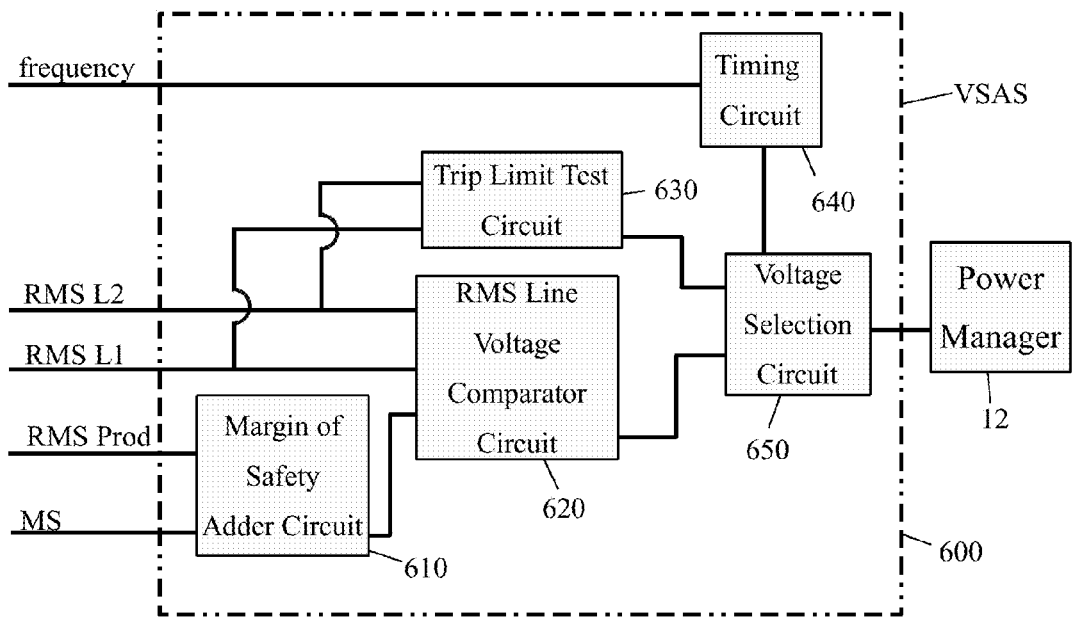
FIG. 6 shows a circuit block diagram of a Voltage Supply Auto Sensor with input from an RMS Measuring Unit and output to a Power Manager, as may be employed in accord with embodiments of the invention.

FIG. 6 shows a Voltage Supply Auto-Sensor ("VSAS") 600 or means for auto-sensing as may be employed in embodiments. This VSAS may be coupled to, in communication with, or otherwise in receipt of outputs from an RMSMU. The VSAS may include a margin of safety adder circuit 610, an RMS line voltage comparator circuit 620, a trip-limit test circuit 630, a timing circuit 640, and a voltage selection circuit 650. In embodiments these circuit blocks can be implemented in software or firmware (which runs on a circuit) in various combinations. In other words, in embodiments the adder circuit may be a software implementation while the timing circuit and the voltage selection circuit are firmware. Likewise, the reverse may also be true along with other combinations of firmware and software.

Figure 7:
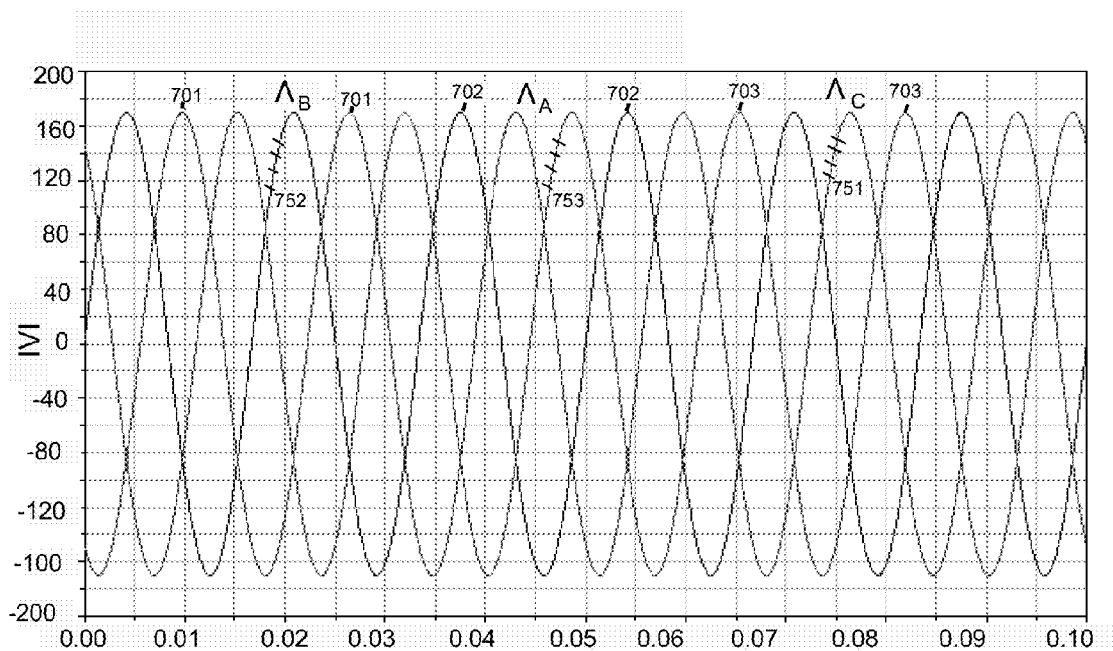
FIG. 7 shows voltage waveforms of each leg of a three-phase power source as may be analyzed by an RMS Measuring Unit and a Voltage Supply Auto Sensor, in accord with embodiments of the invention.

FIG. 7 shows ideal three-phase voltage signals as may be detected by embodiments. Voltage signals A, B, and C are shown as having a voltage range of ±160 V for the three signals shown therein. Sampling intervals for these three signals are shown at 751, 752, and 753. These samples may be taken by the ADC of an RMSMU, at regular intervals, as well as by other devices and methods.

Figure 8:
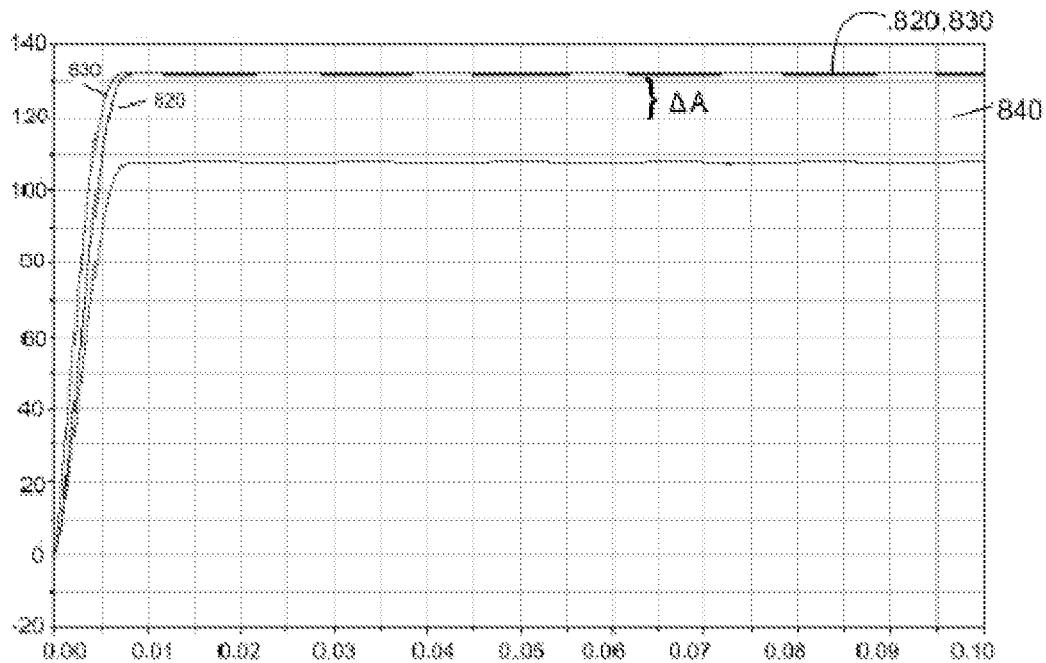
FIG. 8 shows the Root Mean Square average of two sampled voltage waveforms, plotted with the square root of their product over time and their average over time, as may be employed in accord with embodiments of the invention.
Figure 9:
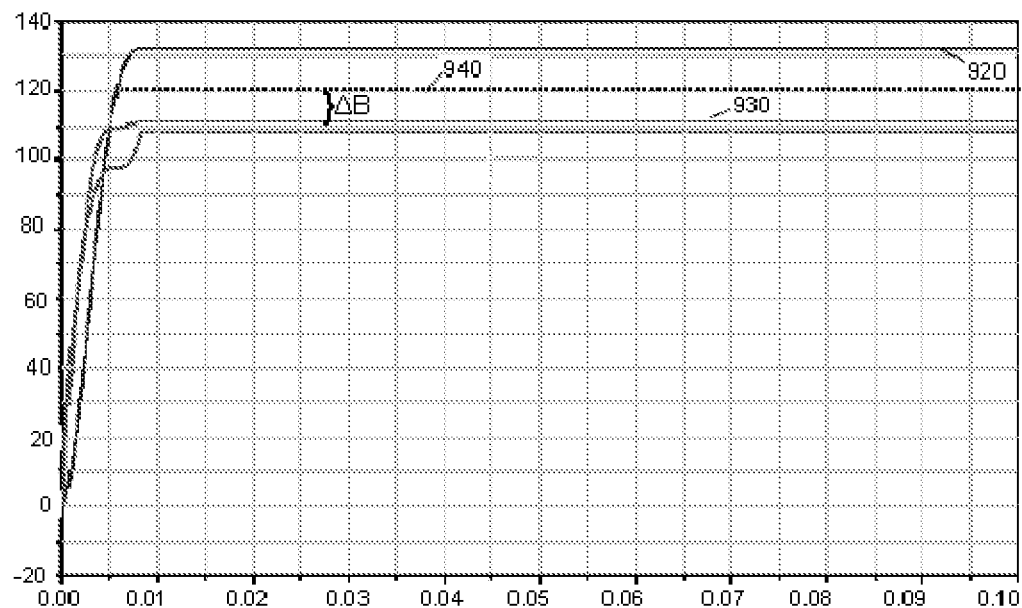
FIG. 9 shows the Root Mean Square average of two sampled voltage waveforms plotted with the square root of their product over time and their average over time, as may be employed in accord with embodiments of the invention.

FIGS. 8 and 9 show the RMS of sampled Lines 1 and 2 graphed over time, as may be tested by embodiments. The RMS values 820, 830, 910, and 920 shown in FIGS. 8 and 9, may be output by the RMS calculators 261 and 263 in embodiments. The average of the output RMS values is shown at 840 and 940 in these figures and the difference between the average RMS line values and the RMS product is shown by the $\Delta_A$ and $\Delta_B$ symbols.

Figure 10:
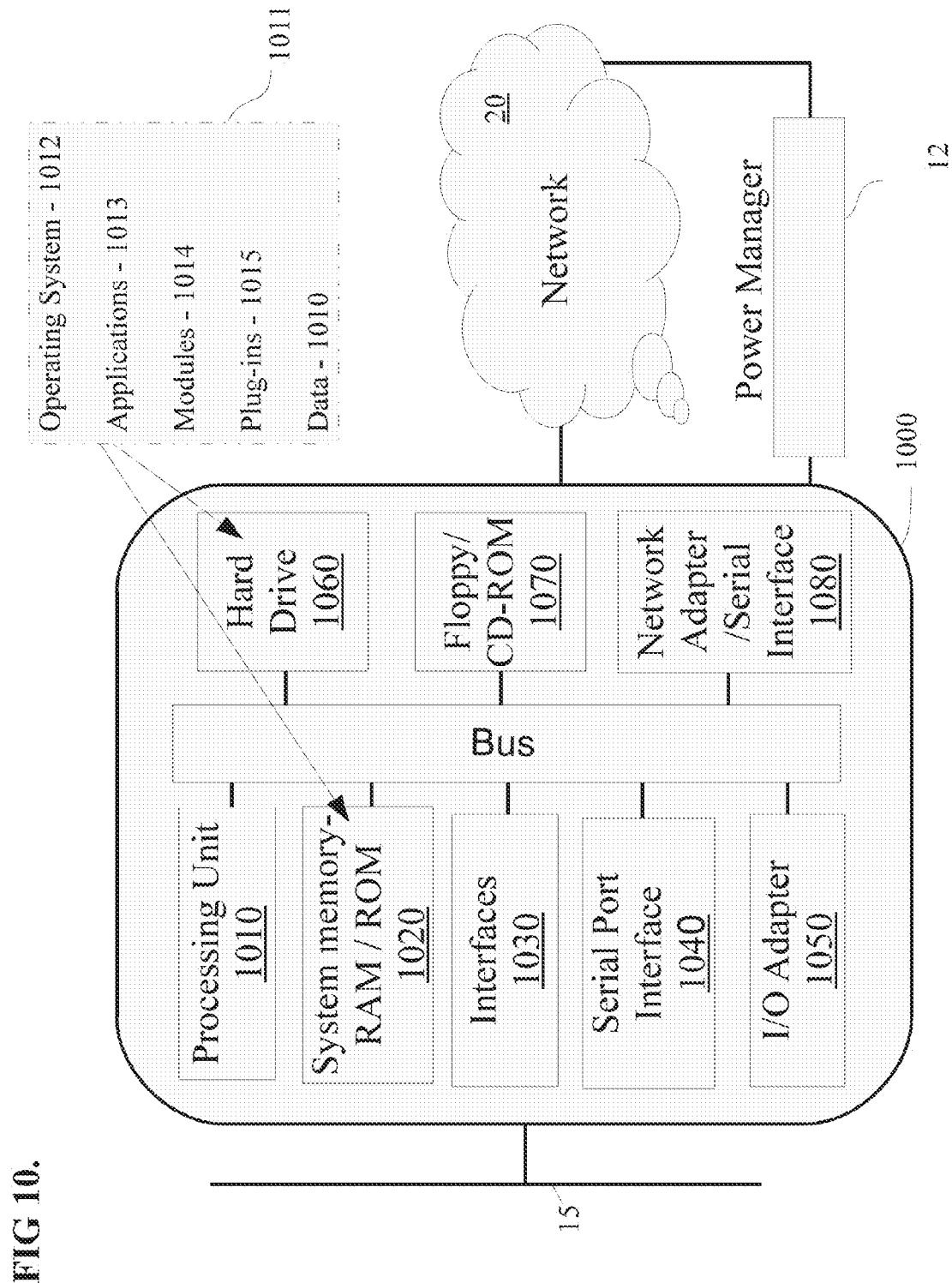
FIG. 10 shows a Voltage Supply Auto Sensor as may be employed with a power manager in accord with embodiments of the invention.

FIG. 10 shows a Voltage Supply Auto-Sensor 1000 as may be employed in embodiments. The VSAS 1000 may include a processing unit 1010, system memory 1020, interfaces 1030, serial port interfaces 1040, an I/O Adapter 1050, a hard drive 1060, a floppy CD-ROM 1070, a network adapter 1080, and a bus coupling these components together. Executable code, loaded on the hard-drive and into processing unit 1010, may include an operating code 1012, applications 1013, modules 1014, plug-ins 1015, and data 1016.

The VSAS 1000 of FIG. 10 may be in communication with the network 20 and power manager 12 of FIG. 1. In embodiments, an RMSMU may also be in communication with the VSAS 1000. Upon receiving values from the RMSMU reflecting the line voltages of the power grid, the VSAS may perform processes embodied in the steps depicted in FIGS. 11 and 12. Other steps, in addition to or instead of these steps, may also be performed by the VSAS. The processor 1010 of the VSAS may be configured by instructions held in memory to perform some or all of the steps taught herein.

Figure 11:
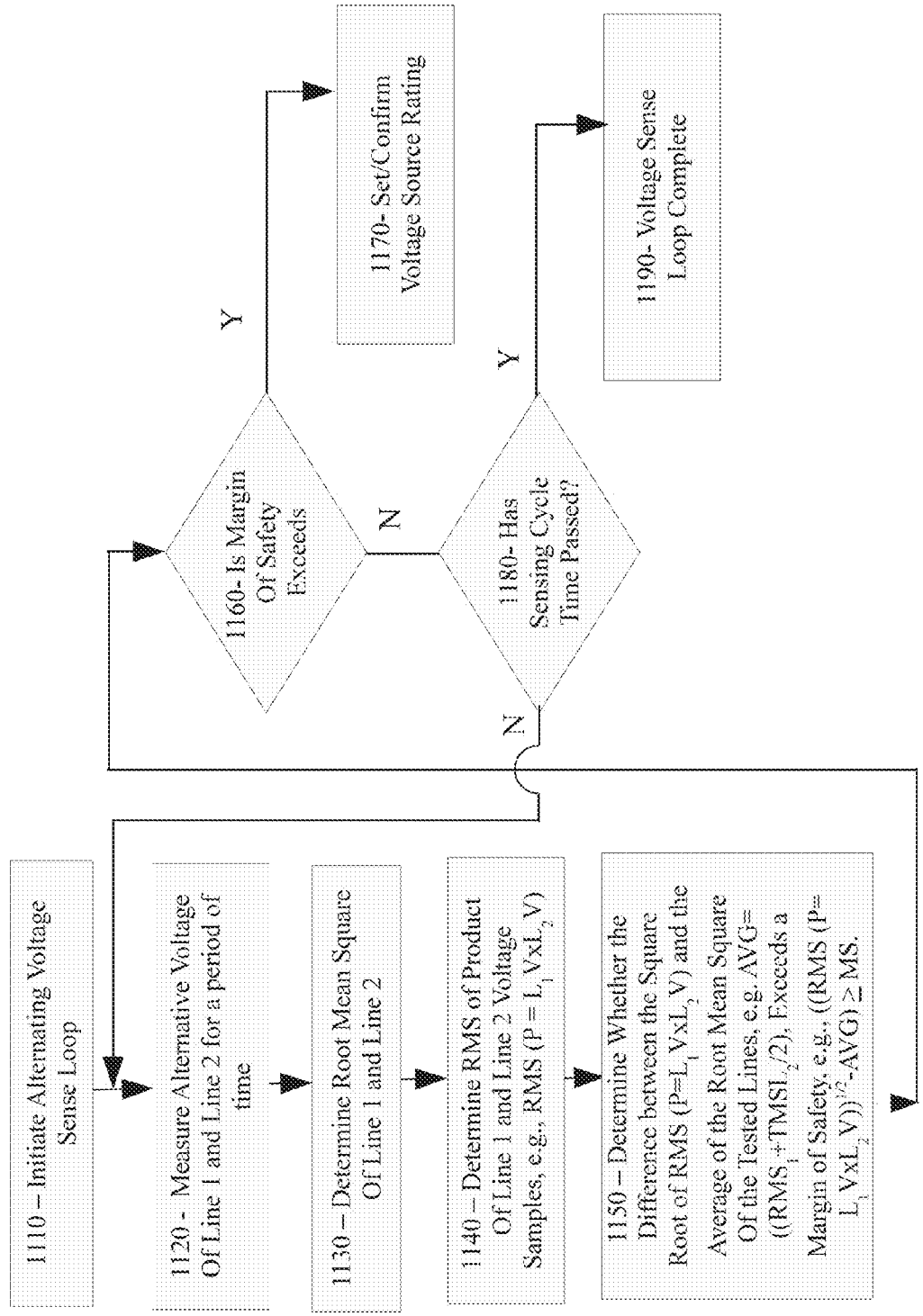
FIG. 11 shows features of a method for automatic voltage supply sensing as may be employed in accord with embodiments of the invention.

FIG. 11 shows features of a process as may be employed in accord with embodiments of the invention. Processes embodying the invention may include the features and steps called out in FIG. 11. Also, embodiments may perform these various steps in different orders, at the same time, and with more or less steps, while remaining consistent with the invention.

In the process of FIG. 11, an alternating voltage sensing loop may be initiated at 1110. After initiation, as shown at 1120, the alternating voltage of two lines, Line 1 and Line 2, may be measured for a period of time. This measurement may be dependent upon the anticipated or known cycle length, cycle time, wavelength, or other parameter of the voltage being measured. In certain embodiments, the voltage may be measured for fractions of a second, as well as for longer periods of time. These measurements may be retained and stored or otherwise captured such that they can be analyzed in subsequent steps or processes.

As shown at 1130, the root mean square of the sample measurements taken at 1120, for the measured lines, may be then determined. As shown at 1140, the RMS of the product of Line 1 and Line 2 voltages may be determined. At 1150, the average of the root mean square of these sampled lines may then be compared with the square root of the RMS determined at 1140. This difference may also be considered or measured against a margin of safety. This margin of safety may serve to ensure that an accurate determination or comparison is made between the product RMS and the average of the $L_1$ RMS and the $L_2$ RMS.

As shown 1160, if the difference between the product and the average is greater than the margin of safety, the voltage source rating may be set or confirmed, as shown at 1170. Conversely, if the margin of safety has not been exceeded, in other words the difference between the square root of the product and the average is too small, additional testing or sensing may be required. As shown at 1180 if a sampling period of time has not passed, additional measurements may take place. Conversely, if a known sampling period of time has passed or been exhausted, then the voltage sensing loop may be considered to be complete, as shown 1190. In this instance no voltage may be assigned because the margin of safety was considered to be too small.

In embodiments, at 1190, as well as at other steps, more or different actions may also be taken. These other actions may include providing alerts, that the sensing was insufficient, assigning a default voltage value, and making recommendations to adjust the margin of safety to a larger or otherwise different value should multiple tests reveal that the margin of safety is only narrowly being missed.

Figure 12:
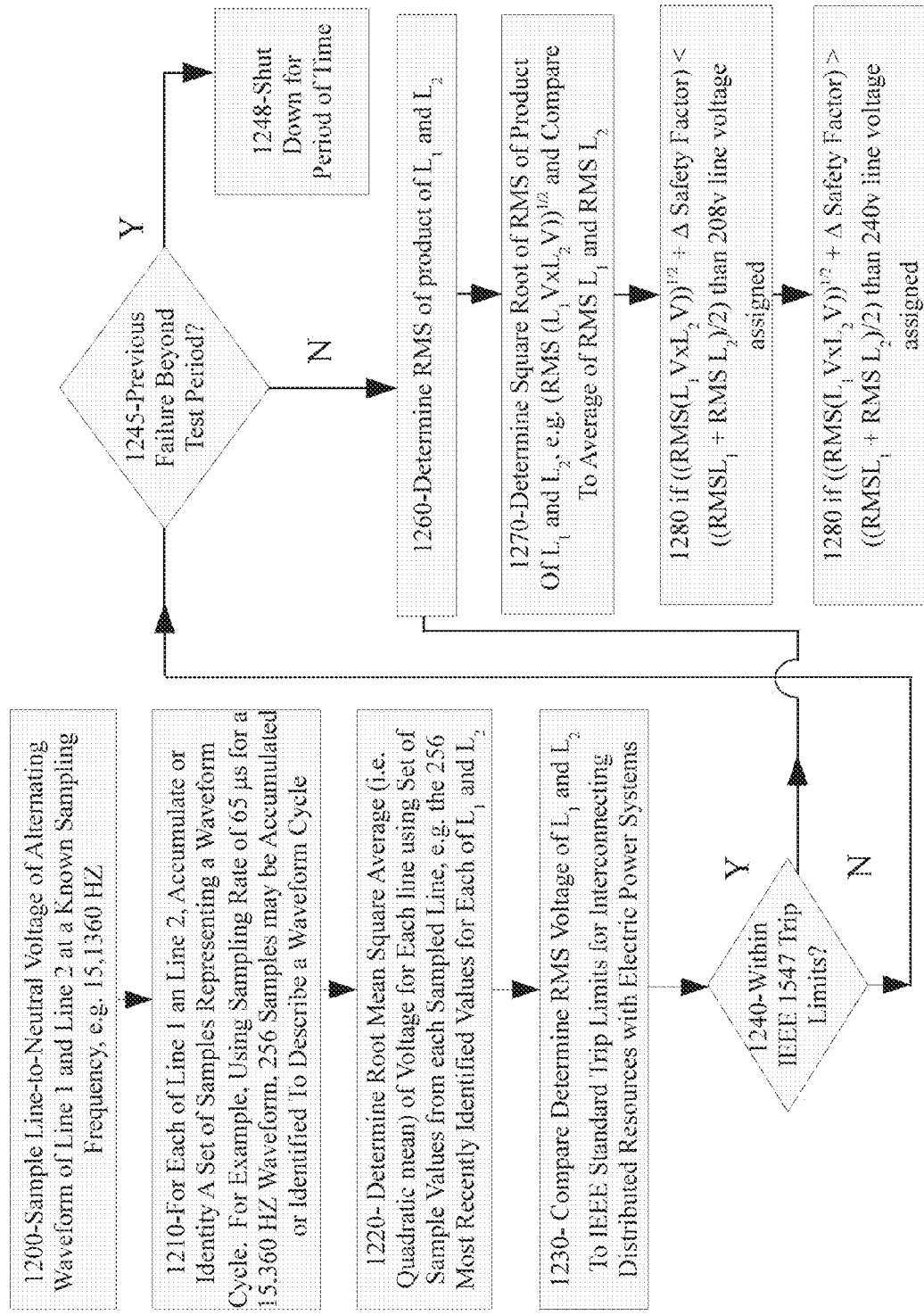
FIG. 12 shows features of a method for automatic voltage supply sensing as may be employed in accord with embodiments of the invention.

FIG. 12 shows a method as may also be employed in accord with embodiments. As with FIG. 11, this method may include additional features, may be performed in various orders, may include fewer features, and may have other variations as well. As can be seen in FIG. 12, at 1200, samples of the line-to-neutral voltage of an alternating waveform be taken at a known sampling frequency for example, 360 Hz. As shown at 1210, for each line, a set of samples may be accumulated and these samples may then be used in subsequent steps for characterizing the waveform.

As shown at 1220, the root mean square average of a set of 256 samples may be determined Other sampling methodologies, criteria, and set sizes, may also be used to determine a "local" RMS voltage. Once the average line voltages are identified, these voltages may be compared to safety standards, such as the IEEE 1547 standard. If a sufficient number of failures has been measured, shut down for a period of time, as shown at 1248, may occur. Comparatively, when a sufficient time has passed between failures, step 1260 may be performed. As shown at 1260, the RMS of the product of Line 1 and Line 2 may be determined. As shown at 1270, the square root of this product may be taken and compared to the averages of the RMS of Line 1 and Line 2. In other embodiments, rather than taking the square root of the RMS of the product of Line 1 and Line 2, other comparative methodologies may also be used.

As shown at 1280, a margin of safety may also be considered and added to the square root of the RMS of the product of Line 1 and Line 2. As shown at 1290, if the square root of the RMS product plus the safety factor is greater than the average of the RMSs of Line 1 plus Line 2 a 240V split phase line voltage may be designated. Likewise, if the square root of the RMS product plus the safety factor is less than the average of the RMSs of Line 1 plus Line 2, a 208V three phase line voltage may be designated.

Other combinations of averaging and comparison can also be conducted. For example, it is not strictly necessary to compute a square root at all given that the RMS values are compared to other RMS values in the trip limits. It is equally valid to compare squared-RMS measurements, which removes the square root, to squared-RMS trip limits.

In addition, in embodiments, after designation the power manager or other system controller may be configured to reset the microinverter or other sensing device to a specific power supply, e.g., 208V or 240V, to specifically configure the microinverter rather than rely on autosensing. However, if the autosensed supply differs from that assigned by the Power Manager, a fault may be triggered that serves to prevent the microinverter or other device from starting up.

Processes and methods shown in FIGS. 11 and 12 may be performed by an RMSMU and a VSAS, by combination of these devices, and by other devices or other means as well. When carrying out the processes and methods of the invention the VSAS and the RMSMU may be configured in numerous ways and may also be combined into a single device.

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises" and/or "comprising," when used in this specification, specifies the presence of stated features, integers, steps, operations, elements, and/or components, but do not preclude the presence or addition of one or more other features, integers, steps, operation, elements, components, and/or groups thereof.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present invention has been presented for purposes of illustration and description, but is not intended to be exhaustive or limited to the invention in the form disclosed. Many modifications and variations will be apparent to those of ordinary skill without departing from the scope and spirit of the invention. The embodiment was chosen and described in order to best explain the principles of the invention and the practical application, and to enable others of ordinary skill in the art to understand the invention for embodiments with various modifications as are suited to the particular use contemplated.

What is claimed is:

1. A method of detecting single or multiphase voltage, the method comprising:
    in a circuit, determining an RMS value of an alternating voltage on a first line and designating this RMS value as a first line RMS value;
    in a circuit, determining an RMS value of an alternating voltage on a second line and designating this RMS value as a second line RMS value;
    in a circuit, determining the product of alternating voltage samples from the first line and the second line, determine the square root of an RMS value of this product, and designate this product as a product RMS value;
    in a circuit, comparing the product RMS value with the first line RMS value and the second line RMS value; and
    based on the comparison of values, designating the first line and the second line as carrying a split-phase voltage or a multiphase voltage.

2. The method of claim 1 wherein the designation of the first line and the second line as split-phase voltage or multiphase voltage based on the comparison of values, excludes consideration of voltage phase angles in the first line and the second line.

3. The method of claim 1 further comprising:
    determining the square of the first line RMS value;
    determining the square of the second line RMS value; and
    using the squared first line RMS value and the second line RMS value when comparing the product RMS value with the first line RMS value and the second line RMS value.

4. The method of claim 1, wherein designating the first line and the second line further includes:
    determining the average of the first line RMS value and the second line RMS value and determining whether the square root of the product RMS value is greater than or less than the average.

5. The method of the claim 4 further comprising:
    determining whether the difference between the product RMS value and the average is larger than a safety factor.

6. The method of claim 1 further comprising:
    maintaining a waiting state when the comparison of values provides an inconclusive designation because the difference in compared values falls in an inconclusive range.

7. The method of claim 1 wherein two or more designations are made by an inverter when the inverter is initially connected to a power grid.

8. The method of claim 1 wherein the comparison of values for designating the first line and the second line is conducted and maintained for a minimum transient dissipation time period, the transient dissipation time period designated to minimize the consideration of initial line transients.

9. The method of claim 1 further comprising:
    reporting a voltage designation via a communication link, the voltage designation being received and stored for later retrieval.

10. The method of the claim 9 further comprising:
    at a power manager, overriding reported voltage designations.

11. The method of claim 1 further comprising:
    reporting a voltage designation to a power manager, the power manager being in communication with multiple microinverters, the power manager comparing received designations reported to the power manager from the microinverters.

12. The method of claim 1 further comprising:
    after a period of time has passed since designating the first line and the second line as carrying a single phase voltage or a multiphase voltage, comparing a square root of a product RMS value with a first line RMS value and a second line RMS value, and, based on the comparison of values, verifying a previous voltage designation for the first line and the second line.

13. The method of claim 1 wherein the first line voltage is a split-phase voltage and wherein the second line voltage is a three-phase voltage.

14. The method of claim 1 further comprising:
    comparing the first line to neutral voltage to a line voltage trip limit; and
    comparing the second line to neutral voltage to a line voltage trip limit.

15. The method of claim 1 wherein each of the method steps is performed by a microinverter.

16. The method of the claim 15, wherein during a synchronization, the microinverter is powered by power from at least one of the first line or the second line.

17. The method of claim 1 further comprising:
    after designating the first line and the second line as carrying a split-phase voltage or a multiphase voltage, providing a voltage to a load consistent with the voltage designation.

18. The method of claim 1 further comprising:
    transmitting the voltage designation to a plurality of inverters receiving voltage from the first line or the second line.

19. A voltage supply auto-sensor comprising:
    a comparator circuit having three inputs,
    the first input receiving an RMS value of a measured alternating voltage for a first voltage signal, the first voltage signal representing voltage measured from a first line of a power grid,
    the second input receiving an RMS value of a measured alternating voltage for a second voltage signal, the second voltage signal representing voltage measured from a second line of the power grid,
    the third input receiving a a square root of a product of the RMS values of the measured alternating voltages received at the first input and the second input; and
    a voltage selection circuit in communication with the comparator circuit, the voltage selection circuit receiving an output from the comparator circuit, the output including an indicator as to whether measurement received at the third input is greater than or less than the average of the measurements received at the first input and the second input,
    the voltage selection circuit configured to output an indicator designating the alternating line voltage of the power grid.

20. A method of auto-sensing alternating power grid line voltage, the method comprising:

in a circuit, determining the root mean square average of an alternating voltage on a first power line;

in a circuit, determining the root mean square average of an alternating voltage on a second power line, the first line and the second line receiving power from the same power supply grid;

in a circuit, calculating the square root of the product of the determined root mean square of the first power line and the second power line; and in a circuit, ascertaining whether the average of the determined root mean square of the first power line and the second power line is greater than or less than the calculated square root of the product, and subsequently assigning a grid classification to the power of the first power line and the second power line.

21. An inverter comprising:

a root mean square measuring unit (RMSMU), the RMSMU including a first line voltage input and a second line voltage input, the RMSMU including at least one Root Mean Square (RMS) calculator circuit, and the RMSMU including at least one RMS multiplier circuit, the RMS multiplier circuit configured to output the square root of the multiplied product of the RMS of the voltage on the first line voltage input and RMS of the voltage on the second line voltage input; and a voltage supply auto-sensor (VSAS), the voltage supply auto sensor in communication with the root mean square measuring unit, the VSAS further comprising an RMS line-voltage comparator circuit and a voltage selection circuit.

22. The inverter of claim 21 wherein the RMSMU is a root means square measuring means and wherein the VSAS is a voltage supply auto-sensing means.

* * * * *